United States Patent [19]

Anderson

[11] Patent Number: 5,039,874
[45] Date of Patent: Aug. 13, 1991

[54] METHOD AND APPARATUS FOR DRIVING AN INTEGRATED-CIRCUIT OUTPUT PAD

[75] Inventor: Daryl E. Anderson, Corvallis, Oreg.

[73] Assignee: Hewlett-Packard Company, Palo Alto, Calif.

[21] Appl. No.: 494,196

[22] Filed: Mar. 15, 1990

[51] Int. Cl.[5] .................. H03K 3/01; H03K 5/12; H03K 19/094

[52] U.S. Cl. .................... 307/270; 307/263; 307/448; 307/451; 307/592; 307/594

[58] Field of Search ............... 307/443, 448, 451, 270, 307/263, 592, 594–595

[56] References Cited

U.S. PATENT DOCUMENTS

| | | | |
|---|---|---|---|
| 4,719,369 | 1/1988 | Asano et al. | 307/451 |
| 4,731,553 | 3/1988 | Van Lehn et al. | 307/270 |
| 4,825,101 | 4/1989 | Walters, Jr. | 307/270 |
| 4,829,199 | 5/1989 | Prater | 307/451 |
| 4,855,623 | 8/1989 | Flaherty | 307/270 |
| 4,961,010 | 10/1990 | Davis | 307/451 |

Primary Examiner—Stanley D. Miller
Assistant Examiner—Margaret Rose Wambach

[57] ABSTRACT

A binarily programmable IC output pad driver includes a pair of FET drivers, one of which is always drivingly connected to the chip output pad. A second driver is selectively connected to the pad for driving the same in concert with the first driver in order to increase signal transition speed on the output pad. With both drivers driving, noise on the output pad increases and, if the particular application is effected by the increased noise level, signals applied to input pads on the chip disconnect the second driver to reduce pad noise.

12 Claims, 1 Drawing Sheet

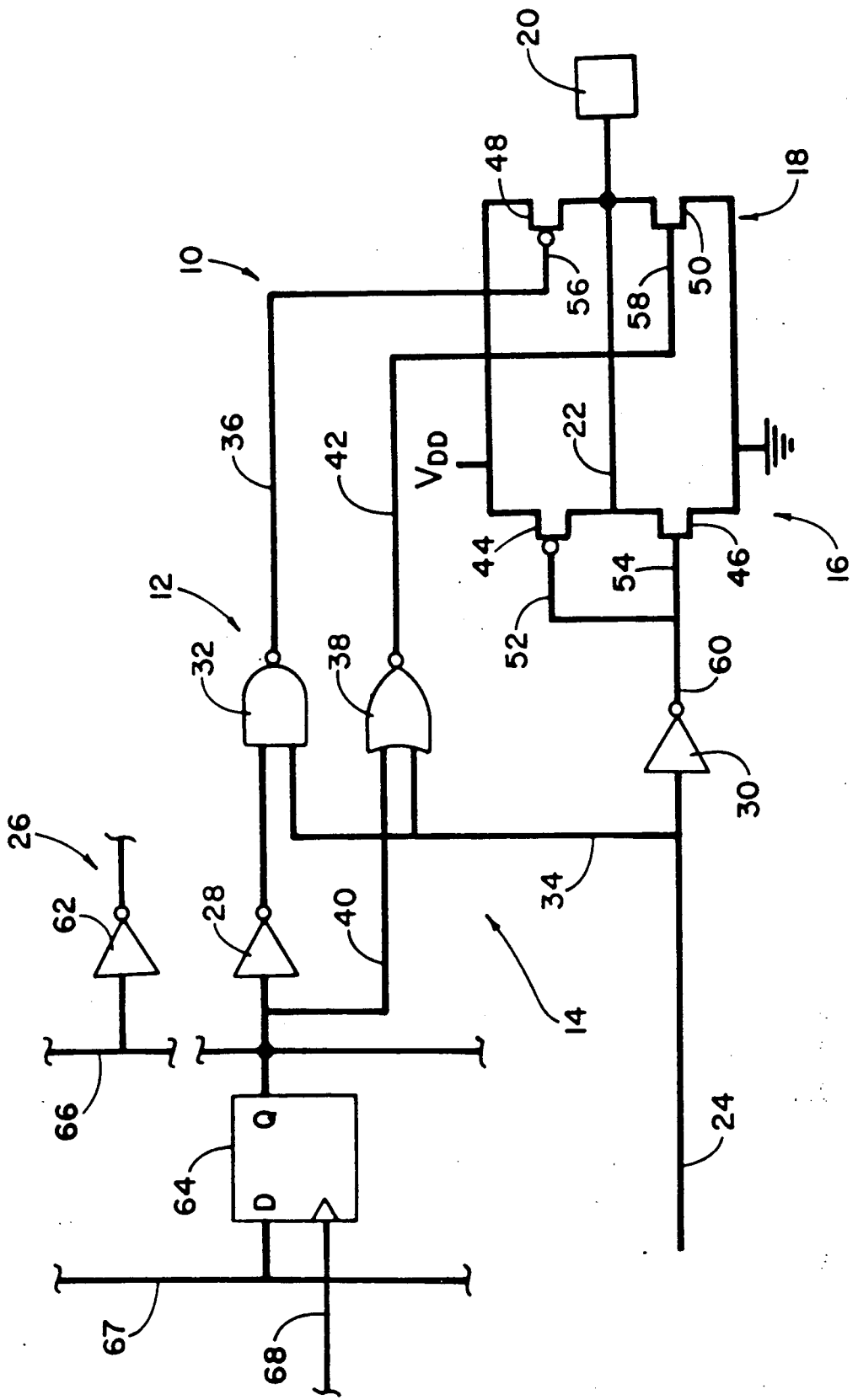

METHOD AND APPARATUS FOR DRIVING AN INTEGRATED-CIRCUIT OUTPUT PAD

BACKGROUND OF THE INVENTION

1. Field of the Invention

The present invention relates to methods and apparatus for driving an integrated-circuit (IC) output pad and more particularly to such methods and apparatus which include logic circuit controls.

2. Description of the Related Art

Integrated logic circuits such as microprocessors and memories generate output signals comprising either a high logic state, referred to as a "1," or a low logic state, referred to as a "0." Such integrated logic circuits are commonly referred to as chips. Typically FET transistors connected in series form the output stage for a selected output terminal of the chip. The juncture of the transistors is tied to the terminal, which is referred to as a pad. The logic signal generated by the integrated circuit on the chip is applied to the gates of the FETs thereby driving the output pad.

The drivers are necessary because of capacitance or current loads which appear on the pad when the chip is interconnected with other components. When there are a large number of pads on the chip, there can be a large inductance in the chip's ground line. When the signal on a number of pads switches states simultaneously, which is not unusual for a chip of the type described, a large noise spike in the ground line occurs.

The problem of noise on chip pads is recognized in U.S. Pat. No. 4,731,553 to Van Lehn et al. In Van Lehn et al., a pair of output drivers are provided, one of which drives a logic level low-to-high transition with the other driver operating in the high logic level steady-state stage. Each driver is connected to a separate power supply with the object being to isolate power supply nodes of those pad drivers which remain in a given output state from noise created by other pad drivers which are making a logic transition.

While Van Lehn et al. may achieve this end, it does so at the expense of adding a time delay circuit and a number of logic gates for each pad, as well as a separate power supply, to the chip. As noted in Van Lehn et al., as the desired speed of operation of a logic circuit increases, noise also increases. In designing logic circuits, selecting the speed of operation of the circuit is a function of the amount of noise which can be tolerated in a particular application. The faster the logic circuit output pads are driven, the more noise is generated.

SUMMARY OF THE INVENTION

The present invention comprises a method of driving an integrated circuit (IC) output pad responsive to an IC output signal. The IC output signal is applied to the inputs of first and second pad drivers. The output of each pad driver is connected to the output pad. The IC output signal switches between high levels and low levels while the signal is so applied and the driver outputs are so connected.

Apparatus is provided for implementing the method.

It is a general object of the present invention to provide a method and apparatus for driving an IC output pad which overcomes the above-enumerated prior art disadvantages.

It is a more specific object of the present invention to provide such a method and apparatus in which the tradeoff between logic circuit signal speed and noise is selectable after the circuit is manufactured.

It is another specific object of the present invention to provide such a method and apparatus in which such a tradeoff is selectable by a user of the logic circuit depending upon the logic circuit application.

The foregoing and other objects, features and advantages of the invention will become more readily apparent from the following detailed description of a preferred embodiment which proceeds with reference to the drawings.

DETAILED DESCRIPTION OF THE PREFERRED EMBODIMENT

Indicated generally at 10 is a portion of a circuit for driving an integrated-circuit (IC) output pad. Circuit 10 includes a subcircuit, indicated generally at 12, which further includes a pad driver logic circuit, indicated generally at 14, and a pair of pad drivers, indicated generally at 16, 18. An IC output pad 20 is connected to drivers 16, 18 via conductor 22. An IC output signal is generated by an integrated circuit (not shown), which in the present case is assumed to be a microprocessor, and is applied to a conductor 24. The signal on conductor 24 switches between high and low logic levels, which are referred to herein as "1" and "0," respectively. Circuit 10 and the microprocessor producing the signal applied to conductor 24 are fabricated on the same chip. Although not all are shown, the chip includes a plurality of output pads, like pad 20, each having an associated subcircuit, like subcircuit 12. A portion of an adjacent subcircuit is indicated generally at 26.

Consideration will now be given to the structure and operation of subcircuit 12. Subcircuit 12 includes therein inverters 28, 30. Each of the inverters operates in the usual fashion in that when a "1" is applied to the input thereof, the output is a "0" and vice versa.

The output of inverter 28 is applied to one of the inputs of a NAND gate 32. The other input to NAND gate 32 is connected to conductor 24 via conductor 34. The output of NAND gate 32 is applied to a conductor 36. The NAND gate functions in the usual fashion in that the output thereof is at a low level only when each input is at a high level. For all other inputs, e.g., both low levels or one low and one high, the output of NAND gate 12 is "1."

A NOR gate 38 has one input thereto tied to the input of inverter 28 via conductor 40 and the other input thereto tied to conductor 24 via conductor 34. The output of NOR gate 38 is applied to conductor 42. When either or both inputs to NOR gate 38 are "1," the output thereof is "0." When both inputs of NOR gate 38 are "0," the output thereof is "1." Conductors 36, 42 are referred to herein as first and second outputs of logic circuit 14.

Pad driver 16 includes therein a p-channel FET 44 and an n-channel FET 46, referred to herein as first and third FETs, respectively. Pad driver 18 also includes a p-channel FET 48 and an n-channel FET 50, referred to herein as second and fourth FETs, respectively. Each of the FETs include a gate 52, 54, 56, 58. Gate 56 is connected to conductor 36, gate 58 is connected to conductor 42 and gates 52, 54 are connected to a conductor 60 which in turn is connected to the output of inverter 30. Conductor 22, as previously mentioned, is connected to pad 20 and also to the juncture of FETs 44, 46 and to the juncture of FETs 48, 50. One side of FETs 44, 48 is tied to a conventional power supply V_{DD}. One side of FETs 46, 50 is grounded as indicated by the usual symbol for ground. Ground is referred to herein as a reference potential.

In operation, FETs 44, 48, which as will be recalled are p-channel FETs, conduct when the signal on gates 52, 56 is at a "0" logic level thereby connecting $V_{DD}$ to conductor 22. When the logic level on gates 52, 56 is "1" FETs 44, 48 are cut-off thereby isolating $V_{DD}$ from conductor 22. FETs 46, 50, on the other hand, are off when the signal on gates 54, 58 is at a "0" logic level, thereby isolating ground from conductor 22, and are on when the gate signal is at a "1" logic level thereby grounding conductor 22.

For convenience, the logical operation of the FETs are summarized in the following chart:

| GATE | FETs 44, 48 | FETs 46, 50 |
| --- | --- | --- |
| "0" | On | Off |
| "1" | Off | On |

Subcircuit 26 includes therein an inverter 62. Inverter 62 corresponds to inverter 28 in subcircuit 12. Subcircuit 26 is substantially identical to subcircuit 12, although is not shown beyond inverter 62. Subcircuit 26 includes a logic circuit, like logic circuit 14, of which inverter 62 is a part; a pair of pad drivers (not shown), like pad drivers 16, 18 and a pad (also not shown), like pad 20. A separate logic signal from the microprocessor is applied to subcircuit 26 in the same fashion that the signal on conductor 24 is applied to subcircuit 12. For each logic output of the microprocessor circuit, a separate subcircuit, like subcircuits 12, 26 drives an associated pad, like pad 20.

A flip-flop 64 includes an output terminal Q which is connected to a conductor 66. Conductor 66 is connected to the input of each inverter which corresponds to inverters 28, 62 in each of the subcircuits, like subcircuits 12, 26, in circuit 10. An input terminal D is connected to a conductor 67 which makes up a portion of an input/output bus for the chip. A clock terminal on flip-flop 64 is connected to a conductor 68 which in turn is connected to an input pad (not shown) on the chip. Flip-flop 64 operates in the usual manner in that each time there is a logic level transition from "0" to "1" on conductors 68, the value appearing on terminal D of the flip-flop is applied to terminal Q and held there until the next such transition from "0" to "1."

In one mode of operation, a "0" is applied to conductor 67 in the chip input/output bus and thereafter a transition from "0" to "1" is caused to occur on the chip pad to which conductor 68 is connected thereby clocking the "0" status on terminal D to terminal Q of flip-flop 64. A "1" thus appears at the output of inverter 28. A "0" appears on conductor 40, one of the inputs to NOR gate 38. The microprocessor output signal on conductor 24 is therefore passed through NAND gate 32 and NOR gate 38 and appears on conductors 36, 42, respectively. With gates 56, 58 being driven with the same signal, FETs 48, 50 operate complementary relative to one another, i.e., when one is on the other is off and vice versa. FETs 48, 50 thus apply the signal appearing on conductor 24 to pad 20.

In a similar fashion, inverter 30 passes a signal to conductor 60 which drives gates 52, 54 so that FETs 44, 46 operate complementary to one another in the same fashion as FETs 46, 50. Thus, instead of having the output of one pad driver, like pad driver 16, appear on pad 20 as in the prior art, pad drivers 16, 18 drive pad 20 in parallel. Such parallel driving causes a more rapid transition of the signal on pad 20 than if only a single driver drives the pad. On the other hand, the noise appearing on the ground line, which affects other signals in the chip, when both drivers 16, 18 simultaneously drive the pad may not be acceptable.

If it is determined that the noise level on the ground line is too high, the chip can be switched to operate in a second mode of operation by applying a logic "1" state to conductor 67 and clocking the same to terminal Q of the flip-flop by producing a "0" to "1" logic level transition on the pad to which conductor 68 is connected thereby causing a "1" level to appear on conductor 66. Such causes a "1" level to appear on conductor 40 and a "0" level to appear on the output of inverter 28. With a "0" as one of the inputs to NAND gate 32, conductor 36 is always at a logic level "1" and FET 46 is always off. Similarly, with a "1" on conductor 40, the output of NOR gate 38, on conductor 42, is always at a "0" logic level state and FET 58 is also off. Thus, the juncture of FETs 48, 50 is cut-off from both the power supply and ground and is therefore free to follow the signal produced by FETs 44, 46. Pad 20, and all other pads so connected to conductor 66, are thus driven at a slower, but less noisy, level.

FETs 44, 46 in pad driver 16 continue to be driven as previously described thereby driving conductor 22, and thus pad 20, in response to the signal on conductor 24. Although the speed at which the signal on pad 20 changes is now somewhat slower than when both drivers 16, 18, drive the pad, the noise level is likewise reduced. Thus, the user can adjust the specification of the chip after the chip is manufactured by applying either a "0" or "1" logic level to conductor 67, and clocking the value thereon to conductor 66, depending upon the speed versus noise characteristics desired for the output pads.

It is to be appreciated that additional drivers, like pad driver 18, with additional logic circuits, like logic circuit 14 could be added to each pad in circuit 10. Thus, each pad could be driven by, e.g., six drivers, one of which is always on, like driver 16, with the other five being binarily programmable to be either on or off depending upon the desired speed versus noise characteristics of the output pad.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

I claim:

1. A method of driving an IC output pad responsive to an IC output signal which varies between high and low levels representing logic "1" and "0" states, respectively, said method comprising the steps of:
   providing first and second pad drivers which each produce an output signal responsive to an input signal applied thereto;
   applying the IC output signal to said drivers;
   connecting the output signal of each driver to said output pad;
   causing said IC output signal to switch between high levels and low levels while said signal is so applied and said driver output signals are so connected;

removing the output signal produced by said second driver from the output pad; and causing said IC output signal to switch between high and low levels while the output signal produced by said second driver is removed from the output pad.

2. The method of claim 1 wherein said method further includes the step of driving said first and second drivers substantially simultaneously while the output signal produced by said second driver is connected to the output pad.

3. The method of claim 1 wherein said second driver comprises a pair of FETs each of which has a gate and which further has one side thereof connected to said output pad and wherein the step of selectively removing the output signal produced by said second driver from the output pad comprises the step of biasing the gates of said FETs whereby the same are turned off.

4. The method of claim 1 wherein the step of selectively removing the output signal produced by said second driver from the output pad comprises the step of switching said driver from a first state wherein the output signal thereof switches between high and low levels responsive to the IC output signal to a second state wherein the output signal thereof follows the output signal of said first driver.

5. The method of claim 4 wherein said method further comprises the step of switching said second driver from said second state to said first state.

6. The method of claim 5 wherein said second driver comprises a pair of FETs each of which has a gate and which further has one side thereof connected to said output pad and wherein the step of switching from said second state to said first state comprises the step of biasing said FET gates responsive to said IC output signal.

7. Apparatus for driving an IC output pad responsive to an IC output signal which varies between high and low levels representing logic "1" and "0" states, respectively, said apparatus comprising:
    a first pad driver having input means and output means, said first driver output means being connected to said output and thereby driving the same responsive to a signal applied to said first pad driver input means;
    a second pad driver having input means and output means;
    means for applying the IC output signal to the input means of said drivers;
    means for selectively connecting the output means of said second driver to said output pad, said second driver thereby driving the same responsive to a signal applied to said second pad driver input means while said first driver is so driving; and
    means for selectively disconnecting the output means of said second driver from said output pad while said IC output signal makes a plurality of transitions between high and low levels, said output pad being driven only by said first pad driver when said second driver output means is so disconnected.

8. The apparatus of claim 7 wherein said second driver comprises a pair of FETs each of which has a gate and which further has one side thereof connected to said output pad and wherein said means for selectively disconnecting the output means of said second driver from said output pad comprises means for biasing the gates of said FETs whereby the same are turned off for a period during which said IC output signal makes a plurality of transitions between high and low levels.

9. The apparatus of claim 7 wherein said means for selectively connecting and disconnecting the output means of said second driver comprises means for switching said driver from a first state wherein said second driver drives said output pad responsive to the IC output signal to a second state wherein only said first driver drives said output pad responsive to the IC output signal.

10. The apparatus of claim 7 wherein said apparatus further includes means for driving said first and second drivers substantially simultaneously while the output means of said second driver is connected to said output pad.

11. Apparatus for driving an IC output pad responsive to an IC output signal which varies between high and low levels representing logic "1" and "0" states, respectively, said apparatus comprising:
    first and second FETs each having a gate and further having one side thereof connected to said output pad and the other side thereof connected to a power supply voltage;
    third and fourth FETs each having a gate and further having one side thereof connected to said output pad and the other side thereof connected to a reference potential;
    means for biasing the gates of said first and third FETs whereby said FETs are driven responsive to said IC output signal when said apparatus is in operative condition;
    a logic circuit having first and second input means and first and second output means, said first output means being operatively connected to one of said second or fourth FETs and said second output means being operatively connected to the other of said FETs;
    means for generating first and second logic states operatively connected to said first logic circuit input means, said second logic circuit input means being operatively connected to said IC output signal;
    means for biasing the gates of said second and fourth FETs whereby the same are driven responsive to said IC output signal in response to generation of such a second logic state; and
    means for biasing the gates of said second and fourth FETs whereby the same are turned off in response to generation of such a first logic state, said FETs remaining turned off while said IC output signal makes a plurality of transitions between high and low levels.

12. The apparatus of claim 11 wherein said apparatus further comprises means for driving all of said FETs substantially simultaneously while said second logic state is so generated.

* * * * *

UNITED STATES PATENT AND TRADEMARK OFFICE
CERTIFICATE OF CORRECTION

PATENT NO. : 5,039,874
DATED : August 13, 1991
INVENTOR(S) : Daryl E. Anderson

It is certified that error appears in the above-indentified patent and that said Letters Patent is hereby corrected as shown below:

Column 5:
    Claim 7, line 42 of the Patent, delete "and" and insert therefor --pad--.

Signed and Sealed this

Fifteenth Day of March, 1994

Attest:

BRUCE LEHMAN

Attesting Officer     Commissioner of Patents and Trademarks